(12) United States Patent
Kwon et al.

(10) Patent No.: US 7,199,660 B2
(45) Date of Patent: Apr. 3, 2007

(54) VARIABLE GAIN AMPLIFIER

(75) Inventors: Chong Ki Kwon, Daejon-Shi (KR);
Gyu Hyung Cho, Daejon-Shi (KR);
Mun Yang Park, Daejon-Shi (KR);
Jong Dae Kim, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/730,832

(22) Filed: Dec. 8, 2003

(65) Prior Publication Data

US 2004/0113691 A1 Jun. 17, 2004

(30) Foreign Application Priority Data

Dec. 10, 2002 (KR) .................. 10-2002-0078447

(51) Int. Cl.
*H03F 3/45* (2006.01)

(52) U.S. Cl. ........................ 330/254; 330/261

(58) Field of Classification Search ................. None
See application file for complete search history.

(56) References Cited

U.S. PATENT DOCUMENTS

| | | | |
|---|---|---|---|
| 5,146,180 A * | 9/1992 | Hyakutake | 330/255 |
| 5,418,494 A * | 5/1995 | Betti et al. | 330/254 |
| 5,757,230 A | 5/1998 | Mangelsdorf | |
| 5,883,539 A * | 3/1999 | Kimura | 330/254 |
| 5,896,063 A * | 4/1999 | Marsh et al. | 330/254 |
| 6,084,471 A * | 7/2000 | Ruth et al. | 330/254 |
| 6,522,200 B2 * | 2/2003 | Siniscalchi | 330/254 |

FOREIGN PATENT DOCUMENTS

| | | |
|---|---|---|
| JP | 4227109 | 8/1992 |
| JP | 6326536 | 11/1994 |

OTHER PUBLICATIONS

"A 270 MHz, 1 V pk-pk, Low-Distortion Variable Gain Amplifier in 0.35 um CMOS process", S. Tan, et al., ESSCIRC 2002, pp. 307-310.
"High Frequency/high dynamic range CMOS VGA", W.C. Song, et al., Electronics Letters, Jun. 22, 2000, vol. 36, No. 13, pp. 1096-1098.

* cited by examiner

*Primary Examiner*—Khanh Van Nguyen
(74) *Attorney, Agent, or Firm*—Blakely Sokoloff Taylor & Zafman

(57) ABSTRACT

Disclosed is a CMOS variable gain amplifier (VGA). The variable gain amplifier comprises a voltage-current converter for converting voltages of a wide input range into currents, a current shared circuit for receiving the currents from the voltage-current converter and controlling values of output currents depending on first and second control voltages, and a current-voltage converter for converting the output currents from the current shared circuit into differential voltages depending on a bias voltage in order to obtain a variable gain. The voltage amplifier having a variable gain is provided by controlling the value of the output current of the drain terminal against the gate voltage of the NMOS transistor constituting the current shared circuit. Therefore, an integrated circuit (IC) type variable gain amplifier operating a high speed at a low supply voltage can be obtained.

8 Claims, 2 Drawing Sheets

VARIABLE GAIN AMPLIFIER

BACKGROUND OF THE INVENTION

1. Field of the Invention

The present invention relates to a CMOS variable gain amplifier (VGA), which can provide a function of controlling a gain of input signals with both low distortion and high-speed operating range, by allowing the amplifier to have a variable gain by controlling the value of an output current of its drain terminal against a gate voltage of the NMOS transistor, can control a voltage gain with a wide gain control range and can be embedded in the IC.

2. Background of the Related Art

Performance parameters of VGA that must be considered in designing the CMOS variable gain amplifier may include maximum of signal-to-noise ratio (SNR) for a desired signal value, a frequency bandwidth, low distortion, the input signal level that guarantees desired linearity, noise characterisitcs, gain control range, and the like. Further, its dependence on the temperature variation or supply voltage can not be excluded. In particular, it is not easy to design a CMOS VGA circuit having the operating frequency range of over 100 MHz in view of device technology characteristics. Furthermore, due to limitations in reduction of the threshold voltage in the MOS device, the input/output signal level is limited. It is, thus, difficult to expect a smooth operation of VGA for a low power supply because of smaller input signal range.

Therefore, it is difficult to implement the CMOS variable gain amplifier with a low power consumption characteristics at the low voltage as an integrated circuit.

SUMMARY OF THE INVENTION

Accordingly, the present invention has been made in view of the above problems, and it is an object of the present invention is to provide a CMOS variable gain amplifier that provides a function of variable gain for a large input signal range according to the control voltage at a low supply voltage and has a wideband characteristic.

Another object of the present invention is to provide a CMOS variable gain amplifier with low power consumption, that can be implemented as IC.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve the above objects, according to the present invention, there is provided a variable gain amplifier, including a voltage-current converter for converting voltages of a wide range into currents, a current shared circuit for receiving the currents from the voltage-current converter and controlling values of output currents depending on first and second control voltages, and a current-voltage converter for converting the output currents from the current shared circuit into differential voltages depending on a bias voltage in order to obtain a variable gain.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE EMBODIMENTS

Figure 1:
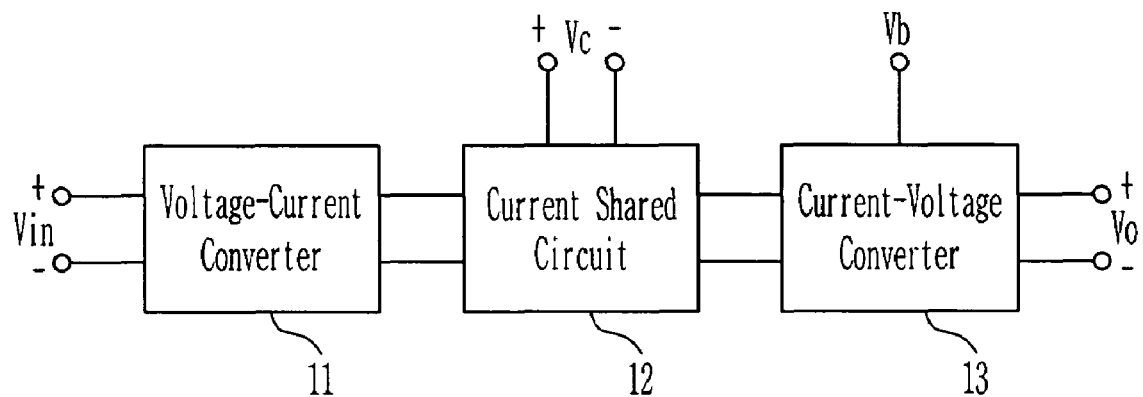
FIG. 1 is a block diagram illustrating a basic construction of a CMOS variable gain amplifier according to the present invention.

Reference will now be made in detail to the preferred embodiments of the present invention, examples of which are illustrated in the accompanying drawings, in which like reference numerals are used to identify the same or similar parts.

FIG. 1 is a block diagram illustrating a basic construction of a CMOS variable gain amplifier according to the present invention.

As shown in FIG. 1, the CMOS variable gain amplifier includes a voltage-current (V-I) converter 11 for converting the input voltages (Vin+ and Vin−) into currents, a current shared circuit 12 for receiving the converted currents from the voltage-current converter 11 as an input and controlling its transconductance depending on control voltages (Vc+ and Vc−) to control the value of the current, and a current-voltage (I-V) converter 13 for converting the currents inputted from the current shared circuit 12 into voltages depending on a bias voltage (Vb).

Figure 2:
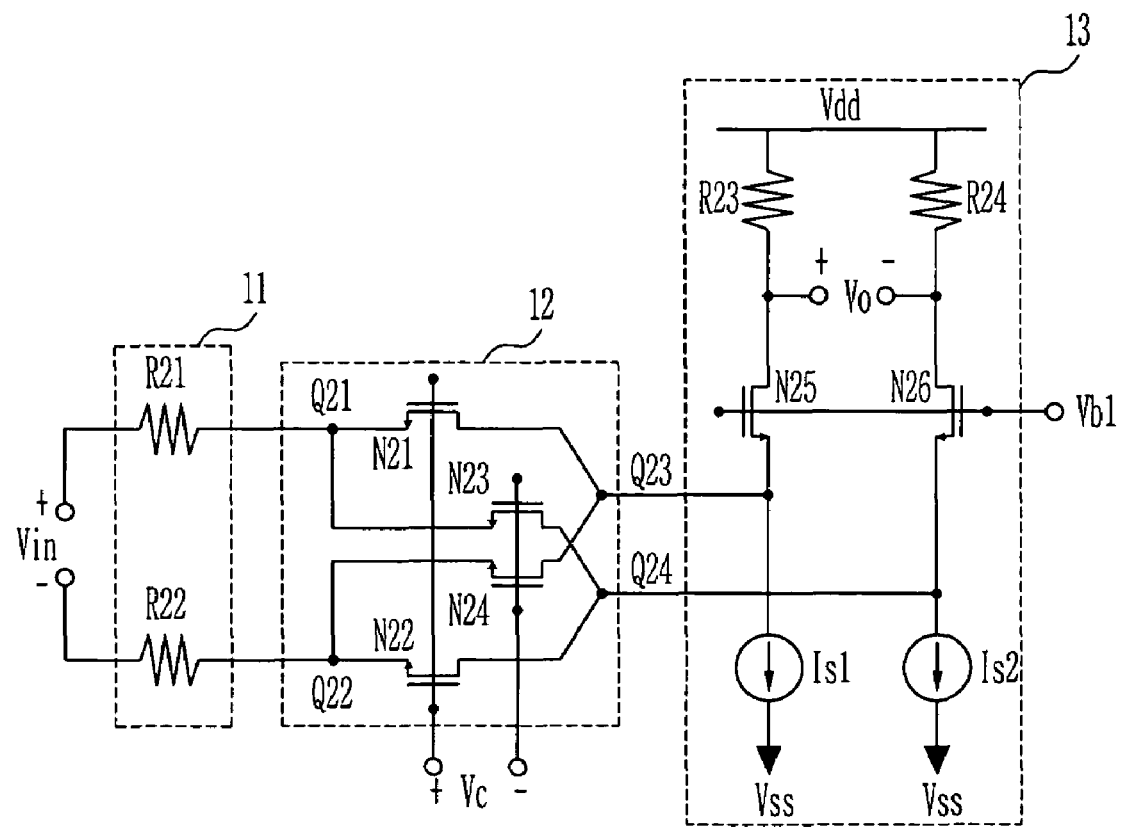
FIG. 2 is a circuit diagram illustrating the construction of a CMOS variable gain amplifier according to one embodiment of the present invention.

FIG. 2 is a circuit diagram illustrating the construction of a CMOS variable gain amplifier according to one embodiment of the present invention. The construction of the CMOS variable gain amplifier will now be described with reference to FIG. 1.

The voltage-current converter 11 has first and second resistors R21 and R22. The first resistor R21 is connected between the first input voltage Vin+ terminal and a first node Q21, and the second resistor R22 is connected between the second input voltage Vin− terminal and a second node Q22.

The current shared circuit 12 includes first and second NMOS transistors N21 and N22 driven by the first control voltage Vc+ and third and fourth NMOS transistors N23 and N24 driven by the second control voltage Vc−. The current shared circuit 12 controls the output current values of the drain terminals against the gate voltages of the first~fourth NMOS transistors N21~N24. The first NMOS transistor N21 is connected between the first node Q21 and a third node Q23 and is driven by the first control voltage Vc+. The second NMOS transistor N22 is connected between the second node Q22 and a fourth node Q24 and is driven by the first control voltage Vc+. The third NMOS transistor N23 is connected between the first node Q21 and the fourth node Q24 and is driven by the second control voltage Vc−. The fourth NMOS transistor N24 is connected between the second node Q22 and the third node Q23 and is driven by the second control voltage Vc−.

The current-voltage converter 13 includes third and fourth resistors R23 and R24, fifth and sixth NMOS transistors N25 and N26, and first and second current sources Is1 and Is2. The third resistor R23 is connected between the power supply terminal Vdd and the first output terminal Vo+ and the fourth resistor R24 is connected between the power supply terminal Vdd and the second output terminal Vo−. The fifth NMOS transistor N25 driven by the bias voltage Vb1 is connected between the first output terminal Vo+ and the third node Q23. The sixth NMOS transistor N26 driven by the bias voltage Vb1 is connected between the second output terminal Vo− and the fourth node Q24. Further, the first current source Is1 is connected between the third node Q23 and the ground terminal Vss. The second current source Is2 is connected between the fourth node Q24 and the ground terminal Vss.

The method of driving the variable gain amplifier constructed above according to the present invention will be below described.

The first and second input voltages Vin+ and Vin− are converted into the currents by the first and second resistors R21 and R22 constituting the voltage-current converter 11. These currents are then supplied to the current shared circuit 12.

In the current shared circuit 12, the first~fourth NMOS transistors N21, N22, N23 and N24 have a double balance source coupled pair shape. A variable output current is obtained by controlling transconductance in the triode region by means of the control voltages Vc+ and Vc− each applied to the gate terminals of the transistors. The current flowing into the drain terminal of each of the transistors can be expressed into the following [Mathematical Equation 1]~[Mathematical Equation 4].

$$I_{N21} = K\left[\left[\left(V_{GS} + \frac{V_c}{2} - V_{TH}\right)\right]\left(\frac{Vin}{2}\right) - \frac{1}{2}\left(\frac{Vin}{2}\right)^2\right]$$ [Equation 1]

$$I_{N22} = K\left[\left[\left(V_{GS} + \frac{V_c}{2} - V_{TH}\right)\right]\left(-\frac{Vin}{2}\right) - \frac{1}{2}\left(-\frac{Vin}{2}\right)^2\right]$$ [Equation 2]

$$I_{N23} = K\left[\left[\left(V_{GS} - \frac{V_c}{2} - V_{TH}\right)\right]\left(\frac{Vin}{2}\right) - \frac{1}{2}\left(\frac{Vin}{2}\right)^2\right]$$ [Equation 3]

$$I_{N24} = K\left[\left[\left(V_{GS} + \frac{V_c}{2} - V_{TH}\right)\right]\left(-\frac{Vin}{2}\right) - \frac{1}{2}\left(-\frac{Vin}{2}\right)^2\right]$$ [Equation 4]

wherein $V_c = (Vc+) - (Vc-)$, $K = \mu C_{OX}(W/L)$, $V_{TH}$ is the threshold voltage of the transistor.

Therefore, the differential output current that is applied from the current shared circuit 12 to the current-voltage converter 13 at the next stage is same to [Equation 5]. This output current is converted into the output voltage Vo by the load at the output stage.

$$I_O = I_{N21} + I_{N24} - I_{N22} - I_{N23}$$ [Equation 5]

Further, a condition where respective transistors operate in the triode region can be expressed into the following [Mathematical Equation 6].

$$V_{GS} > V_{TH}, V_{GS} - V_{TH} > V_{DS}$$ [Equation 6]

wherein $V_{GS}$ is a gate-source voltage of each of the transistors and $V_{DS}$ is a drain-source voltage of each of the transistors.

The current-voltage converter 13 converts the variable current inputted from the current shared circuit 12 into the output voltage. The current bias is decided by the first and second current sources Is1 and Is2. This is closely related to the linearity and the driving capability of the variable gain amplifier. The fifth and sixth NMOS transistors N25 and N26 for inputting the bias voltage Vb1 as the gate voltage to a current applied as a current inputted type in order to operate the bias voltage Vb1 in a stabilized DC bias level, serve to stabilize the common mode voltage at the output stage of the variable gain amplifier.

Figure 3:
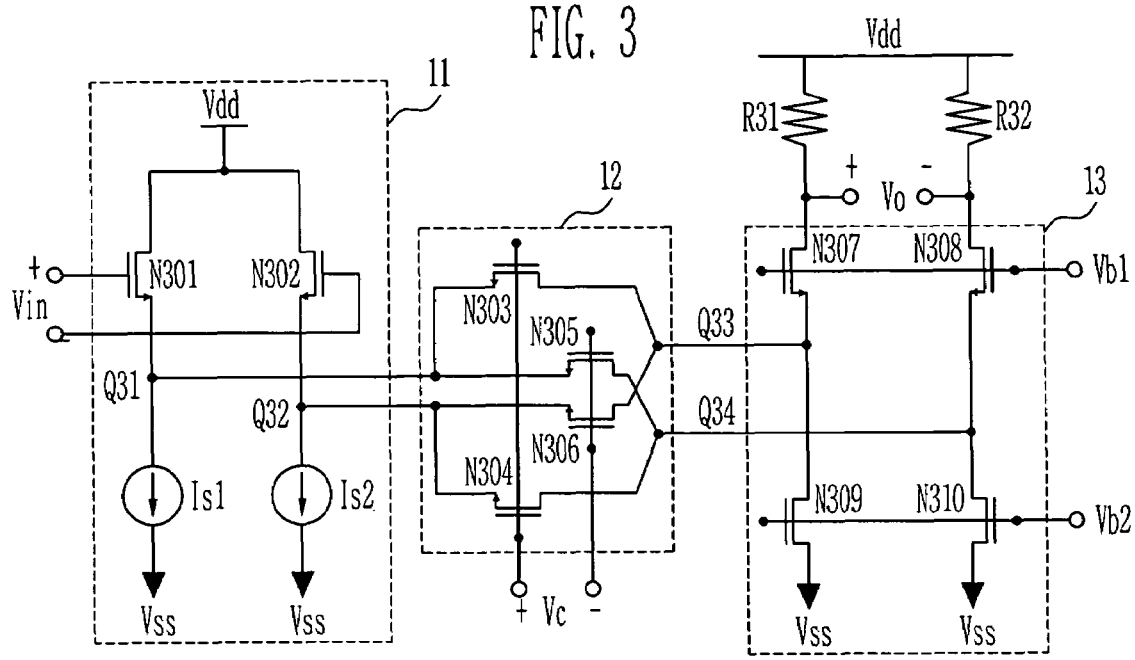
FIG. 3 is a circuit diagram illustrating the construction of a CMOS variable gain amplifier according to another embodiment of the present invention.

FIG. 3 is a circuit diagram illustrating the construction of a CMOS variable gain amplifier according to another embodiment of the present invention, in which the resistors of the current-voltage converter in FIG. 2 are replaced with a differential source follower circuit having MOS transistors in order to accomplish a wide range of an input signal that guarantees the linearity in the DC bias. It is required that the differential source follower circuit be implemented sufficiently considering the value of source impedance. The construction of the differential source follower circuit will be described below.

A voltage-current converter 11 includes a differential source follower having first and second NMOS transistors N301 and N302 for differentially receiving the input voltages and first and second current sources Is1 and Is2. The first NMOS transistor N301 is connected between the power supply terminal Vdd and a first node Q31 and is driven by a first input voltage Vin+. The second NMOS transistor N302 is connected between the power supply terminal Vdd and a second node Q32 and is driven by a second input voltage Vin−. The first current source Is1 is connected between the first node Q31 and a ground terminal Vss, and a second current source Is2 is connected between the second node Q32 and the ground terminal Vss.

A current shared circuit 12 includes third and fourth NMOS transistors N303 and N304 driven by a first control voltage Vc+, and fifth and sixth NMOS transistors N305 and N306 driven by a second control voltage Vc−. The third NMOS transistor N303 is connected between the first node Q31 and a third node Q33 and is driven by the first control voltage Vc+. The fourth NMOS transistor N304 is connected between the second node Q32 and a fourth node Q34 and is driven by the first control voltage Vc+. The fifth NMOS transistor N305 is connected between the first node Q31 and the fourth node Q34 and is driven by the second control voltage Vc−. The sixth NMOS transistor N306 is connected between the second node Q32 and the third node Q33 and is driven by the second control voltage Vc−.

A current-voltage converter 13 includes first and second resistors R31 and R32, seventh and eighth NMOS transistors N307 and N308 driven by a first bias voltage Vb1, and ninth and tenth NMOS transistors N309 and N310 driven by a second bias voltage Vb2. The first resistor R31 is connected between the power supply terminal Vdd and the first output terminal Vo+. The second resistor R32 is connected between the power supply terminal Vdd and the second output terminal Vo−. The seventh NMOS transistor N307 driven by the first bias voltage Vb1 is connected between the first output terminal Vo+ and the third node Q33. The eighth NMOS transistor N308 driven by the first bias voltage Vb1 is connected between the second output terminal Vo− and the fourth node Q34. Further, the ninth NMOS transistor N309 driven by the second bias voltage Vb2 is connected between the third node Q33 and the ground terminal Vss.

The tenth NMOS transistor N310 driven by the second bias voltage Vb2 is connected between the fourth node Q34 and the ground terminal Vss.

In the voltage-current converter 11 of the variable gain amplifier constructed above according to the present invention, the currents outputted through the first and second nodes Q31 and Q32 are decided by the first and second NMOS transistors N301 and N302 for differentially receiving the first and second input voltages Vin+ and Vin− and the first and second current sources Is1 and Is2 each connected to the source terminals of the first and second NMOS transistors N301 and N302.

Figure 4:
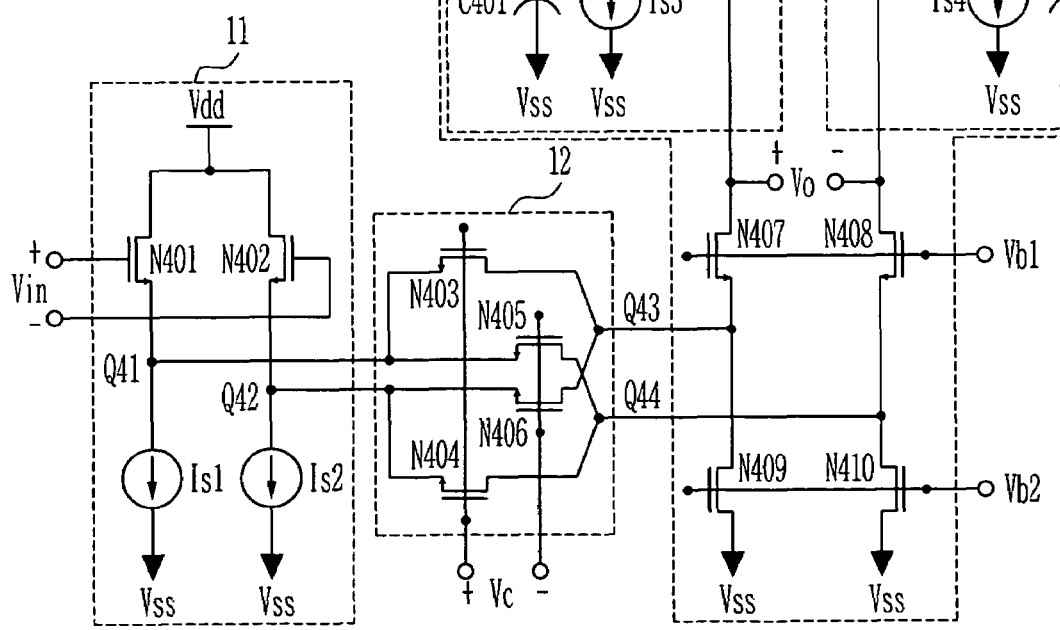
FIG. 4 is a circuit diagram illustrating the construction of a CMOS variable gain amplifier according to still another embodiment of the present invention.

FIG. 4 is a circuit diagram illustrating the construction of a CMOS variable gain amplifier according to a still another embodiment of the present invention in which the output load having the resistors in FIG. 3 is replaced with an active load circuit. The construction of the CMOS variable gain amplifier will now be described in detail.

A voltage-current converter 11 has a differential source follower including first and second NMOS transistors N401 and N402 for differentially receiving the input voltages and first and second current sources Is1 and Is2. The first NMOS transistor N401 is connected between a power supply terminal Vdd and a first node Q41 and is driven by a first input voltage Vin+. The second NMOS transistor N402 is connected between the power supply terminal Vdd and a second node Q42 and is driven by a second input voltage Vin−. The first current source Is1 is connected between the first node Q41 and a ground terminal Vss. The second current source Is2 is connected between the second node Q42 and the ground terminal Vss.

A current shared circuit 12 includes third and fourth NMOS transistors N403 and N404 driven by a first control voltage Vc+ and fifth and sixth NMOS transistors N405 and N406 driven by a second control voltage Vc−. The third NMOS transistor N403 is connected between the first node Q41 and a third node Q43 and is driven by the first control voltage Vc+. The fourth NMOS transistor N404 is connected between the second node Q42 and a fourth node Q44 and is driven by the first control voltage Vc+. The fifth NMOS transistor N405 is connected between the first node Q41 and the fourth node Q44 and is driven by the second control voltage Vc−. The sixth NMOS transistor N406 is connected between the second node Q42 and the third node Q43 and is driven by the second control voltage Vc−.

A current-voltage converter 13 includes first and second active loads 41 and 42, seventh and eighth NMOS transistors N407 and N408 driven by a first bias voltage Vb1, and ninth and tenth NMOS transistors N409 and N410 driven by a second bias voltage Vb2. In the above, the first active load 41 connected between a power supply terminal Vdd and a first output terminal Vo+ includes a first PMOS transistor P401 connected between the power supply terminal Vdd and a fifth node Q45 and driven by the potential of a sixth node Q46, an eleventh NMOS transistor N411 connected between the power supply terminal Vdd and the sixth node Q46 and driven by the potential of a fifth node Q45, and a third current source Is3 and a first capacitor C401 connected in parallel between the sixth node Q46 and a ground terminal Vss. Further, the second active load 42 connected between the power supply terminal Vdd and a second output terminal Vo− includes a second PMOS transistor P402 connected between the power supply terminal Vdd and a seventh node Q47 and driven by the potential of an eighth node Q48, a twelfth NMOS transistor N412 connected between the power supply terminal Vdd and the eighth node Q48 and driven by the potential of the seventh node Q47, and a fourth current source Is4 and a second capacitor C402 connected in parallel between the eighth node Q48 and the ground terminal Vss. The seventh NMOS transistor N407 driven by the first bias voltage Vb1 is connected between the first output terminal Vo+ and the third node Q43. The eighth NMOS transistor N408 driven by the first bias voltage Vb1 is connected between the second output terminal Vo− and the fourth node Q44. Furthermore, the ninth NMOS transistor N409 driven by the second bias voltage Vb2 is connected between the third node Q43 and the ground terminal Vss. The tenth NMOS transistor N410 driven by the second bias voltage Vb2 is connected between the fourth node Q44 and the ground terminal Vss.

In the current-voltage converter 13 of the variable gain amplifier according to still another embodiment of the present invention, the output load is constructed using the active load instead of the resistor. It is thus possible to improve the gain value, and low voltage operation and frequency characteristics. In other words, in FIG. 4, the first and second PMOS transistors P401 and P402 can supply a stabilized bias through the eleventh and twelfth NMOS transistors N411 and N412 and the third and fourth current sources Is3 and Is4. Further, the first and second PMOS transistors P401 and P402 can have low voltage and high gain and can operated at a wideband range, than the load constructed using the resistor, by improving the frequency characteristic of the first and second capacitors C401 and C402. In other words, a reciprocal number of a transconductance of each of the first and second PMOS transistors P401 and P402 become an approximate output load value. This may have a high value even at a voltage range lower than the resistor load, whereby the high gain can be realized. Further, this value is kept in a more stabilized DC voltage level at the output stage through a negative feedback connection of the first and second PMOS transistors P401 and P402 and the eleventh and twelfth NMOS transistors N411 and N412. Also, there is an advantage that the variable gain amplifier can operate in a high frequency region using frequency compensation capacitance. The frequency characteristic of the variable gain amplifier according to the present invention is dependent on parasitic capacitance at the load resistor or the drain terminals of the active load PMOS transistors P401 and P402. A good frequency characteristic can be thus accomplished by optimizing the size of a constitutional device.

As described above, according to the present invention, a current shared circuit and additional variable current generating unit and output stage voltage generating circuit are used. Therefore, the present invention has new effects that it can simply implement a CMOS variable gain amplifier having low distortion and high frequency bandwidth characteristics at a low supply power and minimize the area accordingly, and allows the variable gain amplifier to be embedded in the IC. Further, the present invention has a new effect that it has a low supply voltage or a function of setting a operation mode control if necessary.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed are:

1. A variable gain amplifier, comprising:
    a voltage-current converter for converting voltages of a wide input range into currents;
    a current shared circuit for receiving the currents from the voltage-current converter and controlling output currents values depending on first and second control voltages; and a current-voltage converter for converting the output currents from the current shared circuit into differential voltages depending on a bias voltage in order to obtain a variable gain;
wherein the voltage-current converter further comprises:
a first NMOS transistor connected between a power supply terminal and a first output terminal and driven by a first input voltage;
a second NMOS transistor connected between the power supply terminal and a second output terminal and driven by a second input voltage;
a first current source connected between the first output terminal and a ground terminal; and
a second current source connected between a second output terminal and the ground terminal.

2. The variable gain amplifier as claimed in claim 1, wherein the current shared circuit comprises:
a first NMOS transistor connected between a first input terminal and a first output terminal and driven by the first control voltage;
a second NMOS transistor connected between a second input terminal and a second output terminal and driven by the first control voltage;
a third NMOS transistor connected between the first input terminal and the second output and driven by the second control voltage; and
a fourth NMOS transistor connected between the second input terminal and the first output terminal and driven by the second control voltage, wherein the output currents are controlled by adjusting transconducances of the first to fourth NMOS transistors.

3. The variable gain amplifier as claimed in claim 1, wherein the current-voltage converter comprises:
a first NMOS transistor connected between a first input terminal and a first output terminal and driven by the bias voltage;
a second NMOS transistor connected between a second input terminal and a second output terminal and driven by the bias voltage;
first and second current sources each connected between the first input terminal and the second output terminal, and a ground terminal; and
first and second resistors each connected between the first and second output terminals, and the power supply terminal.

4. The variable gain amplifier as claimed in claim 1, wherein the current-voltage converter comprises:
a first NMOS transistor connected between a first input terminal and a first output terminal and driven by a first bias voltage;
a second NMOS transistor connected between a second input terminal and a second output terminal and driven by the first bias voltage;
a third NMOS transistor connected between the first input terminal and a ground terminal and driven by a second bias voltage;
a fourth NMOS transistor connected between the second input terminal and the ground terminal and driven by the second bias voltage; and
first and second load means each connected between the first and second output terminals, and the power supply terminal.

5. The variable gain amplifier as claimed in claim 4, wherein each of the first and second load means is a resistor.

6. A variable gain amplifier, comprising:
a voltage-current converter for converting voltages of a wide input range into currents;
a current shared circuit for receiving the currents from the voltage-current converter and controlling output currents values depending on first and second control voltages; and
a current-voltage converter for converting the output currents from the current shared circuit into differential voltages depending on a bias voltage in order to obtain a variable gain;
wherein the current-voltage converter comprises:
a first NMOS transistor connected between a first input terminal and a first output terminal and driven by a first bias voltage;
a second NMOS transistor connected between a second input terminal and a second output terminal and driven by the first bias voltage;
a third NMOS transistor connected between the first input terminal and a ground terminal and driven by a second bias voltage;
a fourth NMOS transistor connected between the second input terminal and the ground terminal and driven by the second bias voltage; and
first and second load means each connected between the first and second output terminals, and the power supply terminal;
wherein each of the first and second load means comprises:
a PMOS transistor connected between the power supply terminal and the output terminal and driven by the potential of a first node;
a NMOS transistor connected between the output terminal and the first node and driven by the potential of the output terminal; and
a capacitor and a current source connected in parallel between the first node and the ground terminal.

7. A variable gain amplifier, comprising:
a voltage-current converter for converting voltages of a wide input range into currents;
a current shared circuit for receiving the currents from the voltage-current converter and controlling output currents values depending on first and second control voltages; and
a current-voltage converter for converting the output currents from the current shared circuit into differential voltages depending on a bias voltage in order to obtain a variable gain;
wherein the voltage-current converter further comprises:
a first resistor for converting a first input voltage into a current; and
a second resistor for converting a second input voltage into a current, the second input voltage being different from the first input voltage.

8. The variable gain amplifier as claimed in claim 7, wherein the current-voltage converter comprises:
a first NMOS transistor connected between a first input terminal and a first output terminal and driven by the bias voltage;
a second NMOS transistor connected between a second input terminal and a second output terminal and driven by the bias voltage;
first and second current sources each connected between the first input terminal and the second output terminal, and a ground terminal; and
third and fourth resistors each connected between the first and second output terminals, and the power supply terminal.

* * * * *